United States Patent
Takizawa et al.

(10) Patent No.: US 7,224,163 B2
(45) Date of Patent: May 29, 2007

(54) MAGNETIC RESONANCE IMAGING DEVICE

(75) Inventors: Masahiro Takizawa, Chiba (JP); Tetsuhiko Takahashi, Saitama (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/511,964

(22) PCT Filed: Apr. 22, 2003

(86) PCT No.: PCT/JP03/05103
§ 371 (c)(1),
(2), (4) Date: Oct. 19, 2004

(87) PCT Pub. No.: WO03/092497
PCT Pub. Date: Nov. 13, 2003

(65) Prior Publication Data
US 2006/0049829 A1    Mar. 9, 2006

(30) Foreign Application Priority Data
Apr. 30, 2002  (JP)  ............................. 2002-129152

(51) Int. Cl.
*G01V 3/00* (2006.01)
(52) U.S. Cl. ...................... 324/307; 324/318
(58) Field of Classification Search ............... 324/307, 324/318
See application file for complete search history.

(56) References Cited

U.S. PATENT DOCUMENTS 4,770,182 A * 9/1988 Damadian et al. .......... 600/410
5,600,244 A   2/1997 Jensen et al.
6,242,916 B1 * 6/2001 King .......................... 324/309

(Continued)

FOREIGN PATENT DOCUMENTS

EP          1102076 A2     5/2001

(Continued)

OTHER PUBLICATIONS

Pruessmann KP et al., SENSE: Sensitivity Encoding for Fast MRI, Magn Reson Med 42:952-962 (1999).*

(Continued)

*Primary Examiner*—Diego Gutierrez
*Assistant Examiner*—Megann E. Vaughn
(74) *Attorney, Agent, or Firm*—Cooper & Dunham LLP

(57) ABSTRACT

A first pulse sequence is executed on an imaging portion of an object to be examined using a multiple receiving coils including a plurality of receiving coils to obtain sensitivity images 701 to 703, each of n in number, which is smaller than the number of examination image. When those sensitivity images are calculated, NMR signals are measured only in a low-frequency region of a k space. Next, a second pulse sequence is executed while phase encoding steps are thinned out to acquire examination images 704 and 705, each of m in number (m>n), of the object with each receiving coil. When sensitivity distributions 707 and 708 are generated on the basis of sensitivity images 701 to 703, if a sensitivity distribution on a slice corresponding to examination images 704 and 705 is not yet measured, it is calculated with a slice interpolation processing on the basis of sensitivity distributions 701 to 703, and an aliasing artifact in examination images 704 and 705 are removed using sensitivity distributions 707 and 708 with a matrix calculation.

17 Claims, 9 Drawing Sheets

U.S. PATENT DOCUMENTS

| | | | |
|---|---|---|---|
| 6,289,232 B1 * | 9/2001 | Jakob et al. | 600/410 |
| 6,396,269 B1 | 5/2002 | Hajnal et al. | |
| 6,556,009 B2 * | 4/2003 | Kellman et al. | 324/309 |
| 6,559,642 B2 | 5/2003 | King | |
| 6,710,686 B2 * | 3/2004 | Mertelmeier et al. | 324/314 |
| 6,777,934 B2 * | 8/2004 | Takahashi et al. | 324/309 |
| 2002/0171422 A1 * | 11/2002 | King | 324/307 |

FOREIGN PATENT DOCUMENTS

| | | |
|---|---|---|
| JP | 08191824 | 7/1996 |
| JP | 11262479 | 9/1999 |
| JP | 2001161657 | 6/2001 |
| JP | 2001198108 | 7/2001 |
| WO | WO0141639 A1 | 6/2001 |

OTHER PUBLICATIONS

Takahashi T et al., Magnetic Resonance Imaging Method and Apparatus, Abstract of international patent application WO01/41639.*

Murakami, J.W. et al., "Intensity Correction of Phased-Array Surface Coil Images", Magnetic Resonance In Medicine, 1996, vol. 35, No. 4, pp. 585-590.

Schaeffter, T. et al., "Fast 1H Spectroscopic Imaging Using A Multi-Element Head Coil Array", Magnetic Resonance in Medicine, 1998, vol. 40, No. 2, pp. 185-193.

Pruessmann, K.P. et al., "SENSE: Sensitivity Encoding for Fast MRI", Magnetic Resonance In Medicine, 1999, pp. 952-962.

Ra, J.B. et al., "Fast Imaging Using Subencoding Data Sets from Multiple Detectors", 1993, pp. 142-145.

Pruessmann, K.P. et al., "Coil Sensitivity Maps for Sensitivity Encoding and Intensity Correction", Institute of Biomedical Engineering and Medical Informalities, University and ETH Zurich, Switzerland, p. 2087.

Murakami, J.W. et al.; "Intensity Correction of Phased-Array Surface Coil Images"; Magnetic Resonance In Medicine, vol. 35, No. 4; Apr. 1996; pp. 585-590.

Schaffer, T. et al.; "Fast 1H Spectroscopic Imaging Using A Multi-Element Head-Coil Array"; Magnetic Resonance In Medicine, vol. 40, No. 2; Aug. 1998; pp. 185-193.

Bezooijen R., et al. "Implementing Sense in Isotropic Mobitrak CE MRA" Proceedings of the International Society for Magnetic Resonance in Medicine, Ninth Meeting Proceedings, vol. 1, Apr. 21, 2001.

Sallam, A., et al. "Constructing 2.5d Model of the Human Brain By Slice Interpolation of Axial MRI Images", Proceedings of the Lasted International Conference Signal Processing, Pattern Recognition, and Applications ACTA Press, pp. 127-131.

* cited by examiner

MAGNETIC RESONANCE IMAGING DEVICE

TECHNICAL FIELD

The present invention relates to a magnetic resonance imaging apparatus (hereinafter referred to as "MRI apparatus") for imaging a tissue structure inside an object to be examined by utilizing a magnetic resonance phenomenon, more particularly to an MRI apparatus suitable for parallel imaging for rapidly imaging the object using a plurality of receiving coils.

BACKGROUND OF THE INVENTION

In an MRI apparatus, a pulse sequence is sequentially executed while a phase encoding amount given to a nuclear magnetic resonance signal (hereinafter referred to as "NMR signal") is varied, and an echo signal necessary for reconstructing one image is thus acquired. Therefore, imaging time depends on time of repetition (TR) and the repetition number of times of pulse sequence. When the rapid imaging is performed, a multi-echo pulse sequence in which plural echo signals can be measured by executing the pulse sequence one time and a pulse sequence in which the TR is shortened to several ms to several ten ms are generally used.

Meanwhile, when a region around a heart, such as a coronary artery, is imaged, it is necessary to perform imaging more rapidly than in the imaging based on the above pulse sequence. To realize such rapid imaging, a rapid imaging method called "parallel imaging method" is proposed.

The parallel imaging method is a method of reducing the repetition number of pulse sequence by executing the pulse sequence using a plurality of receiving coils while phase encoding steps are thinned out at even intervals, and thus shortening the imaging time. When a measured signal obtained by performing the parallel imaging pulse sequence is simply image-reconstructed, an aliasing artifact is generated in the reconstructed image. The aliasing artifact is generated due to a difference between a field of view (FOV) of image to be obtained and that in which signals are actually measured in the parallel imaging, and it can be removed by performing a matrix calculation using a pre-calculated sensitivity distribution of each receiving coil.

Generally, in the parallel imaging method, the imaging time can be shortened depending on the number of receiving coils. That is, it is possible in principle to thin out the number of phase encoding steps matrix as much as the number of receiving coils from the number of phase encoding steps in the usual imaging. As a result, for example, the imaging time can be shortened 1/N times, where the number of receiving coil is N, in comparison with the imaging performed with the usual phase encoding step number.

However, in the parallel imaging method, a sensitivity distribution of each receiving coil is needed for removing the aliasing artifact generated in the image. To obtain the sensitivity distribution of each receiving coil, it is necessary before imaging to execute a pulse sequence for acquiring a sensitivity distribution of receiving coil in the state where the object is put in an imaging space and wearing the receiving coil, in addition to the pulse sequence for obtaining an examination image of the object in which the phase encoding steps are thinned out. Moreover, when imaging is performed on many slices on various positions in an imaging portion of the object to conduct diagnosis, it is necessary to execute the pulse sequence for the sensitivity distribution acquisition on every slice position to be imaged. Therefore, there is a problem that the total imaging time in the parallel imaging becomes very long.

Techniques of shortening the total imaging time in the parallel imaging includes one in which the sensitivity distribution of receiving coil is acquired by performing three-dimensional measurement. However, because the sensitivity distribution data are similarly acquired on every imaging slice position, the effect of shortening the time is small, and it is desired that the time be further shortened.

Furthermore, when the imaging is performed again on a different slice position after measuring the sensitivity distribution of receiving coils in advance of picturing and imaging the object, it is necessary to re-measure the sensitivity distribution of receiving coil on the present imaging slice position.

A first object of the present invention is to provide an MRI apparatus which can shorten the total imaging time when plural slices of the imaging portion of the object are pictured using the parallel imaging method.

A second object of the present invention is to provide an MRI apparatus which can acquire the sensitivity distribution of receiving coil necessary for removing the aliasing artifact within a short time when the object is imaged using the parallel imaging method.

A third object of the present invention is to provide an MRI apparatus which can acquire the sensitivity distribution of receiving coil necessary for removing the aliasing artifact in a simple manner when the object is imaged using the parallel imaging method.

SUMMARY OF THE INVENTION

To achieve the above objects, a n MRI apparatus according to the present invention includes a plurality of receiving coils for receiving a magnetic resonance signal generated from an object to be examined, sensitivity image data acquiring means for acquiring sensitivity image data of each of the plural receiving coils from plural slice positions separated from each other on the object by executing a first pulse sequence, means for acquiring examination image data of each receiving coil from the plural slice positions adjoining each other on the object by executing a second pulse sequence using the plural receiving coils in a which phase encoding matrix in a k space is thinned out, and an artifact removing means for generating sensitivity distribution data of the plural receiving coils on slice positions of the examination image data on the basis of the plural sensitivity image data and removing an aliasing artifact in the examination image using thus generated sensitivity distribution data of receiving coil.

In the image data of a portion appearing as the aliasing artifact in the image, a data component of one portion is wrapped and superposed on that of another portion. Accordingly, by forming a simultaneous equation in accordance with a correlation among the image data of the plural receiving coils, the sensitivity distribution data of each receiving coil, and the data components on plural points of the imaging cross section and solving these simultaneous equations on the basis of matrix calculation, the superposing data component at the wrapped portion is separated. The aliasing artifact on the image is removed by expanding thus separated image data.

In this manner, to remove the component of aliasing artifact in the image data acquired by executing the second pulse sequence in which the phase encoding steps in the measurement space, i.e. the k space are thinned out, the sensitivity distribution data on each slice position of image data are necessary. These sensitivity distribution data are calculated from the sensitivity image data acquired by executing the first pulse sequence for acquiring measured data of central portion (low-frequency portion) in the k space, whereby the time for acquiring the sensitivity distribution of receiving coil can be shortened.

In the MRI apparatus according to the present invention, the slice number of the sensitivity image data acquired in the first pulse sequence is n in number, which is smaller than m in number of examination image data including the aliasing artifact component acquired in the second pulse sequence. When sensitivity distribution data on a slice position do not exist in the image data for m slices, they are generated by performing interpolation using the above acquired sensitivity distribution data. Therefore, because the repetition number of the first pulse sequence for acquiring the sensitivity distribution of receiving coil can be reduced, the total time of repeatedly executing the first pulse sequence is shortened, and the total imaging time in the parallel imaging including the first pulse sequence and the second pulse sequence can be thus shortened.

Further, the MRI apparatus according to the present invention includes means for acquiring sensitivity image data of each receiving coil for plural slices on slice positions different from each other by executing the first sequence and acquiring aliasing image data of each receiving coil for plural images by executing the second sequence, and means for generating the sensitivity distribution data of each receiving coil on the slice positions of the above sensitivity image data on the basis thereof and removing the aliasing artifact generated in the examination image on the basis of the sensitivity distribution data on the slice positions of the aliasing image data.

Further, in the MRI apparatus according to the present invention, the plurality of receiving coils may include a first receiving coil and a second receiving coil. In this case, it is preferable that the sensitivity distribution of the first receiving coil is more uniform than that of the second receiving coil. Thus, by using as a reference an image having a uniform sensitivity distribution obtained by the first receiving coil, the sensitivity distribution of the second receiving coil can be accurately calculated.

Further, in a structure where the first receiving coil does not have a uniform sensitivity distribution, an image having a more uniform sensitivity distribution than that generated on the basis of the measured data acquired by a single receiving coil is generated by combining the measured data obtained by using a plurality of receiving coils. By using as a reference this image having a uniform sensitivity distribution, the sensitivity distribution of each receiving coil can be accurately calculated.

BEST MODE FOR CARRYING OUT THE INVENTION

First Embodiment

Hereinafter, an MRI apparatus and an MR imaging method according to the present invention will be described with reference to the drawings. First, a first embodiment of the MRI apparatus according to the present invention will be described with reference to FIG. 1 to FIG. 7.

Figure 2:
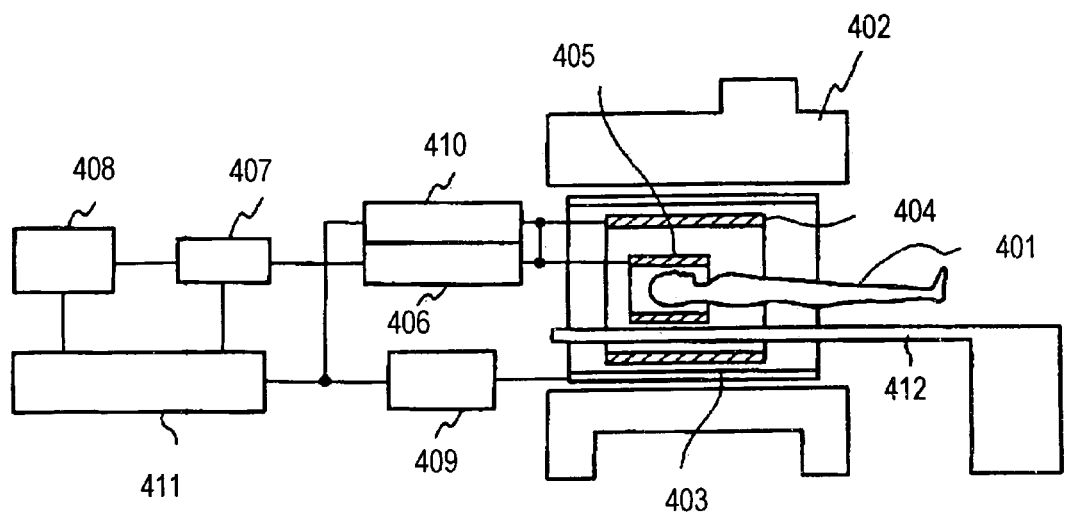
FIG. 2 is a diagram showing a schematic structure of the MRI apparatus according to the first embodiment of the present invention.

As shown in FIG. 2, the MRI apparatus according to this embodiment includes magnet 402 for generating a uniform static magnetic field having a predetermined strength to a space (hereinafter referred to as "imaging space") having a predetermined size for accommodating object 401 to be examined, gradient magnetic field coil 403 for generating gradient magnetic fields to the imaging space, body coil 404 for generating a radio-frequency magnetic field to the imaging space and detecting an NMR signal generated by object 401, and RF probe 405 for detecting the NMR signal generated by object 401. Here and hereinafter, "RF" is an abbreviation of "Radio Frequency." Although FIG. 2 shows an MRI apparatus of horizontal magnetic field type which generates a static magnetic field in a horizontal direction, the present invention can also be applied to an MRI apparatus of vertical magnetic field type which generates the static magnetic field in the vertical direction.

Gradient magnetic field coil 403 includes a plurality of coils for generating gradient magnetic fields in X-, Y-, and Z-directions, each of which generates the gradient magnetic field in response to a signal from gradient magnetic field power source 409. These gradient magnetic fields are superposed on the static magnetic field and used for selecting an imaging slice and encoding the NMR signal.

Body coil 404 is designed to generate an RF magnetic field (RF pulse) in response to a signal output from RF transmission unit 410. Because conductors of body coil 404 are arranged so that its sensitivity distribution becomes substantially uniform, it is also used to receive the NMR signal used to obtain a reference signal for calculating a sensitivity distribution of receiving coil in this embodiment. The RF magnetic field is used to excite nuclear spins in the body of object 404 placed in the imaging space. Meanwhile, the coil for obtaining the reference signal for calculating the sensitivity distribution of receiving coil may be a dedicated receiving coil having a substantially uniform sensitivity distribution, instead of the coil for both transmission and reception.

Signals received by body coil 404 and RF probe 405 are detected by signal detection unit 406, subjected to a signal processing in signal processing unit 407 and then to a calculation processing, and converted into image data. The image data dealt with in the present invention includes examination image data used in diagnosis on the object and sensitivity image data for calculating a sensitivity distribution of coil. Among them, the examination image data used in diagnosis of the object is displayed as an image on display unit 408.

Gradient magnetic field power source 409, RF transmission unit 410, signal processing unit 407, and display unit 408 are controlled by control unit 411. A time chart of the control of control unit 411 is generally referred to as "pulse sequence". Object 401 is laid on bed 412, which is designed to move between the imaging space inside the magnets and the outside of the magnets.

Figure 3:
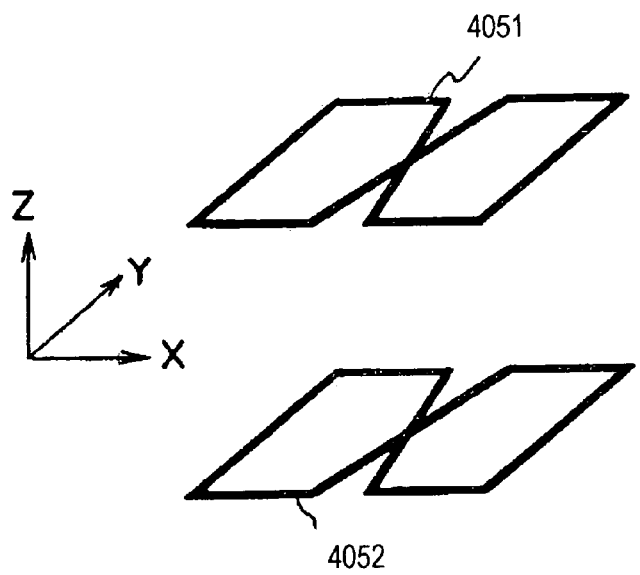
FIG. 3 is a diagram illustrating a receiving coil in the MRI apparatus according to the first embodiment of the present invention.

In the MRI apparatus according to this embodiment, RF probe 405 includes two figure-of-eight shaped coils 4051 and 4052 arranged in the inside space of body coil 405, as shown in FIG. 3. The two receiving coils 4051 and 4052 are arranged opposite at a predetermined interval in the Z direction along an X-Y plane, which receive the NMR signal from the object placed inside the space surrounded by these two receiving coils 4051 and 4052. Meanwhile, in the figures, elements and processings given a four-digit number having an identical first three digits represent an identical element and processing, and the number of their last one digit is given to distinguish each of plural identical elements and processings. Accordingly, they are hereinafter equivalently treated in this specification.

Figure 4:
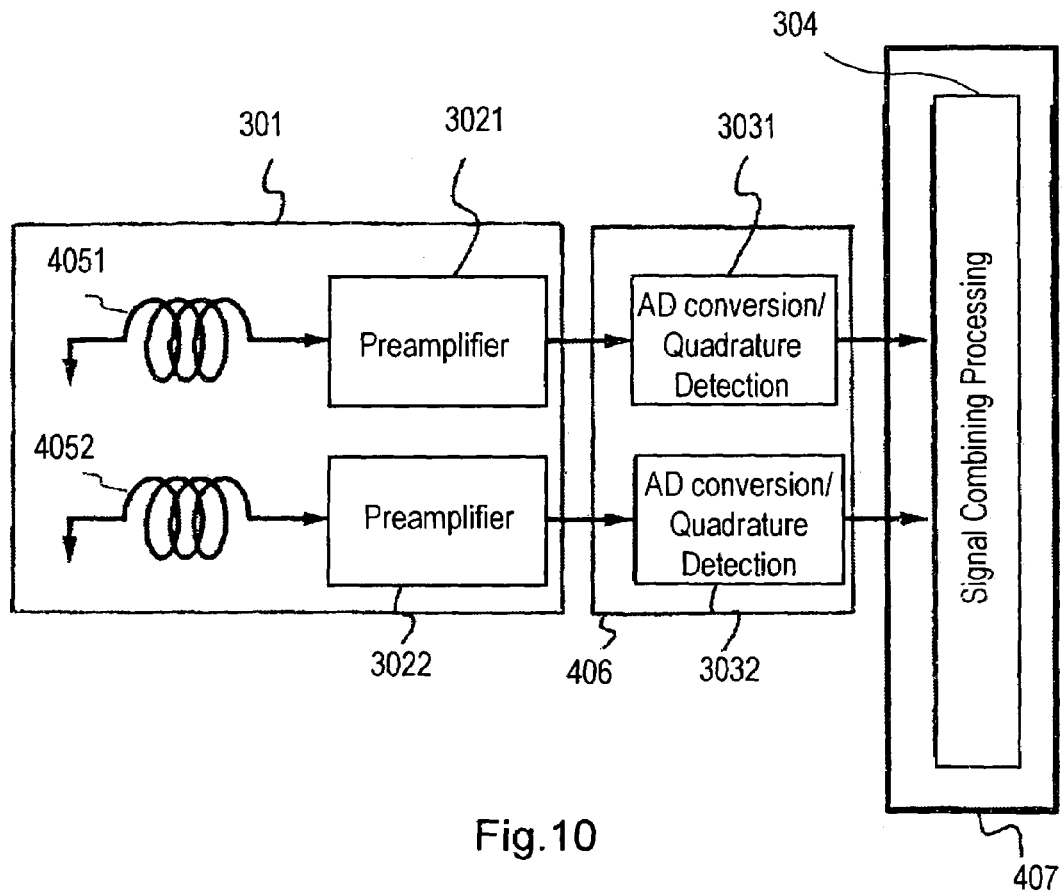
FIG. 4 is a diagram showing a schematic structure of the multiple RF receiving coils and a reception unit in the MRI apparatus according to the first embodiment of the present invention.

Meanwhile, RF probe 405 is constructed with a technique referred in the field of MRI as "multiple receiving coils" or "phased array coil" including a plurality of receiving coils. Two receiving coils 4051 and 4052 of multiple receiving coils 301 are connected with pre-amplifiers 3021 and 3022 as shown in FIG. 4. The reception unit for measured signals received by multiple receiving coils 301 has signal detection unit 406 and signal processing unit 407. In signal detection unit 406, two AD conversion/quadrature detection circuits 3031 and 3032 are arranged in parallel, each of which is connected to outputs of pre-amplifiers 3021 and 3022. Signal processing unit 407 is designed to generate an MR image from signals received by receiving coils 4051 and 4052 by utilizing a Fourier transformation method, a back projection method, a wavelet transformation method, and the like, which includes signal combination processing unit 304 for performing the combination processing on those image signals.

The imaging method of thus constructed MRI apparatus according to this embodiment will be described. The pulse sequence for the imaging may be a general spin-echo pulse sequence or a gradient-echo pulse sequence. Furthermore, it may be a spin-echo type multi-slice pulse sequence or a gradient-echo type multi-slice sequence. For example, in the gradient-echo pulse sequence shown in FIG. 5, nuclear spins are excited by applying thereto RF pulse 601 and slice-selecting gradient magnetic field pulse 602. RF pulse 601 applied here is provided a frequency on the imaging slice position determined depending on a magnetic field gradient of the slice-selecting gradient magnetic field superposed on the static magnetic field, and a frequency band determined depending on a slice thickness. After the nuclear spins inside the slice are excited, the excited nuclear spins are given positional information in a phase direction by the application of phase encoding gradient magnetic field pulse 603. After that, echo signal 606 is measured during the application of readout gradient magnetic field pulse 604, i.e. during sampling window 605. This pulse sequence is repeated plural times at time of repetition (TR) 607. TR 607 is, for example, an interval between applications of RF pulse 6011 in a first pulse sequence and of RF pulse 6012 in the next pulse sequence. By changing an amount of phase encoding gradient magnetic field 603 (product of strength and application time) at every repetition of pulse sequence, the phase encoding amount applied to the nuclear spins is varied, and echo signals from the nuclear spins applied the various phase encoding amounts are detected. This process is repeated as much as the phase encoding step number determined in accordance with the pixel number in the phase encoding direction of the image to be examined, and the signals in number determined in accordance with the pixel number in the readout direction are sequentially measured in sampling window 605. Within image acquisition time 608 a set of echo signals necessary for reconstructing one image is measured. That is, in the conventional imaging method, the number of echo signal is determined as 64, 128, 256, 512, or the like in consideration of spatial resolution of field of view (hereinafter referred to as "FOV") in the phase encoding direction. Further, the echo signals are obtained as time-sequential sampling data usually including 128, 256, 512, 1024, signals or so in consideration of spatial resolution of FOV in the readout direction. Those measured data are stored in a two-dimensional memory space (hereinafter referred to as "k-space") with the phase direction and the readout direction, read out, and two-dimensionally Fourier-transformed, and one MR image is reconstructed.

According to this embodiment, a plurality of adjoining slices of, e.g. m in number are imaged on the examining portion of object 401. Accordingly, the above pulse sequence is sequentially executed on each of those slice positions. Meanwhile, the multi-slice imaging method may be employed here as above.

However, in the MRI apparatus according to this embodiment, the pulse sequence is modified for executing the parallel imaging. That is, according to this embodiment, pre-measurement of MR signal is performed with two receiving coils, i.e. body coil 404 and receiving probe 405 to rapidly perform the parallel imaging. In the MR signal pre-measurement, first, a pulse sequence of pre-measurement in which the size of phase encoding matrix, i.e. the number of phase encoding step is reduced to be one of several fractions of that in the usual imaging is executed to acquire sensitivity image data for n slices included in the examining portion of the object. Among the sensitivity image data for n slices, the data for at least two slices corresponds to the imaging slice position, where the slice number is determined as n<m. Further, to acquire the sensitivity image data for n slices, the pulse sequence shown in FIG. 5 may be applied to the slice positions where the sensitivity image data is acquired, or the multi-slice pulse sequence may be applied so as to measure signals from the slice positions where the sensitivity image data is acquired.

Next, a pulse sequence of imaging (real imaging) in which the phase encoding steps in the k space are thinned out is executed to acquire image data for m slices (m>n) of the examining portion of object 401 using receiving coils 4051 and 4052 forming multiple receiving coils 405. According to this embodiment, the image data for m slices are acquired from sequentially adjoining slice positions. Meanwhile, to acquire the image data for m slices, the multi-slice pulse sequence or a pulse sequence for three-dimensional measurement may be used instead of the pulse sequence shown in FIG. 5.

After that, the sensitivity image data acquired by body coil 404 and receiving probe 405 and the image data acquired by receiving coils 4051 and 4052 of receiving probe 405 are respectively subjected to two-dimensional Fourier transformation and converted into a sensitivity image and an examination image. An aliasing artifact is generated in the examination image reconstructed by the two-dimensional Fourier transformation, which is removed with the following processings.

That is, the sensitivity distribution data of receiving coils 4051 and 4052 are calculated from the sensitivity image obtained with the pre-measurement pulse sequence, an interpolation processing is performed using the calculated sensitivity distribution data to calculate the sensitivity distribution data corresponding to each slice position of the examination image, the sensitivity distribution of receiving coil is calculated using the calculated sensitivity distribution data, and a matrix calculation is performed using this sensitivity distribution and the examination image, whereby the aliasing artifact on the examination image is removed.

In the real measurement, the repetition number of pulse sequence is reduced by thinning out the intervals between phase encoding steps at a fixed rate. This thinning ratio is called "acceleration factor" of the parallel imaging. For example, if every other phase encoding steps are thinned out, the acceleration factor is 2. That is, when the phase encoding step number is 64, all data of 1st to 64th phase encodes are usually measured. Meanwhile, in the parallel imaging with the acceleration factor of 2, data of 1st, 3rd, 5th, . . . , and 63rd phase encodes are measured. At this time, the thinning out ratio is 1/2. Control unit 411 according to this embodiment executes the real-measurement pulse sequence in which the phase encoding steps are thus thinned out to acquire the image data for m slices with receiving coils 4051 and 4052.

Figure 6A:
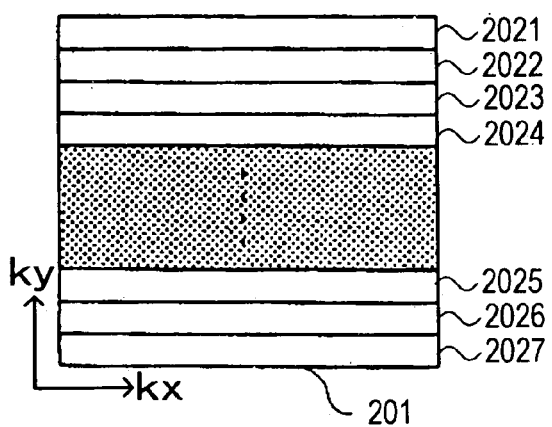
FIG. 6 is a diagram illustrating an aliasing artifact to be removed in the parallel imaging method in the MRI apparatus according to the present invention.

Here, the aliasing of image in the parallel imaging will be described with reference to FIG. 6. FIG. 6(a) shows the case where imaging is done with usual phase encoding steps (usual imaging), the number of which is not reduced. Signals 2021, 2022, . . . , and 2027 obtained with each phase encoding amount are arranged in the k space to form measured data 201 for one image. By Fourier-transforming it, an image without aliasing is obtained as shown in FIG. 6(c).

Figure 6B:
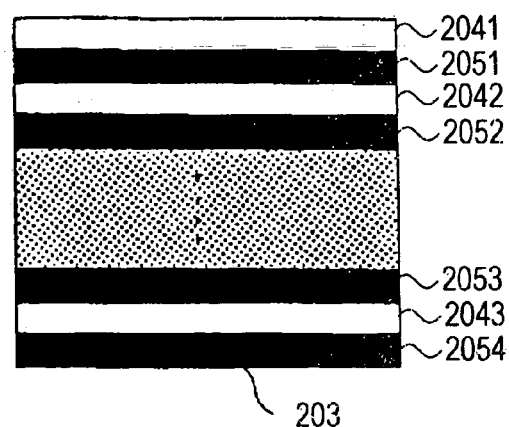
Figure 6C:
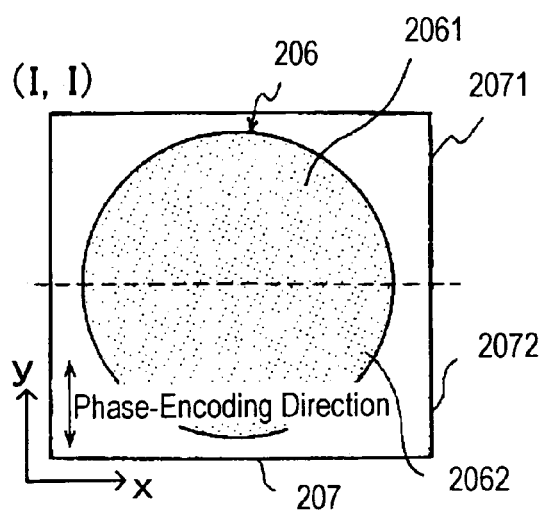

On the other hand, as shown in FIG. 6(b), in the parallel imaging measurement is performed while the interval between the phase encoding steps are e.g. doubled in the same FOV as in the usual imaging to thin out the phase encoding steps. In this case, data are measured on every other lines 2041, 2042, . . . , and 2043 in a ky direction of the k space, and data on lines 2051, 2052, . . . , 2053, and 2054 are not measured. Accordingly, the amount of measured data becomes half and the measured FOV also becomes ½. An MR signal from a portion of the object out of the measured FOV becomes an aliasing component. When the k space including measured data 2041, 2042, . . . , and 2043 is Fourier transformed, image 208 in which an aliasing artifact is generated in the phase encoding direction is obtained as shown in FIG. 6(b). That is, object's image 2061 indicated in upper portion 2071 of image 207 and object's image 2062 in lower portion 2072 as shown in FIG. 6(c) become aliasing and appear as aliasing image 208 shown in FIG. 6(d).

Thus generated aliasing in image 208 can be removed with a signal processing method disclosed in, e.g. SENSE: Sensitivity Encoding for Fast MRI (Klass P. Pruessmann et. al), Magnetic Resonance in Medicine 42: 952–962(1999), etc.

Figure 6D:
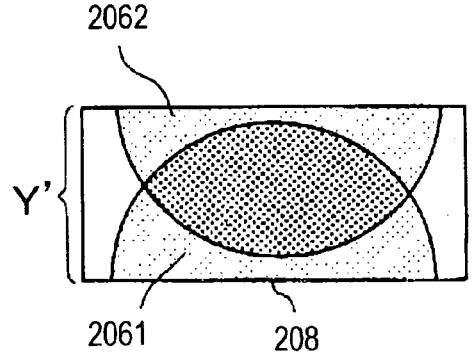

Here, a calculation method of aliasing removal will be described. If the image matrices in the x and y directions are X and Y respectively, a pixel value on a coordinate (x, y) ($1 \leq x \leq X$, $1 \leq y \leq Y$) in the image is si (x, y). Here, a subscript "i" is the number of receiving coil, where $2 \leq i \leq N$. In the case of FIG. 6(d), since the phase encoding steps are thinned out to be half, the matrix in the phase encoding direction of the image after subtraction is Y'=Y/2. When a coordinate of the image of FIG. 6(d) is (x, y') ($1 \leq y' \leq Y'$), its pixel value si'(x, y') is expressed by formula (1) since two portions 2071 and 2072 of original image 207 are superposed on each other. Here, a is a fixed number.

$$s'_i(x, y') = \frac{s_i(x, y') + s_i(x, y' + Y')}{a} \quad (1)$$

Next, the sensitivity distribution of receiving coil and the image will be described. When a two-dimensional sensitivity distribution of ith receiving coil is ci(x, y), received signal si(x, y) is a product of sensitivity distribution ci(x, y) of receiving coil and proton density distribution p(x, y) of the object, which can be expressed by formula (2).

$$s_i(x,y) = c_i(x,y) \times p(x,y) \quad (2)$$

Here, formula (1) can be expressed by formula (3) using formula (2).

$$s'_i(x, y') = \frac{c_i(x, y') \times p_i(x, y')}{a} + \frac{c_i(x, y' + Y') \times p(x, y' + Y')}{a} \quad (3)$$

$$= \frac{1}{a} \sum_{j=1}^{2} c_i(x, y' + (j-1) \times Y') \times p(x, y' + (j-1) \times Y')$$

When it is given for easy understanding that:

$$S_i = s'_i(x,y')$$

$$C_{ij} = c_i(x,y'+(j-1)\times Y)$$

$$P_j = p(x,y'+(j-1)\times Y) \quad (4)$$

formula (3) is expressed as formula (5).

$$S_i = \frac{1}{a} \sum_{j=1}^{2} C_{ij} \times P_j \quad (5)$$

Formula (5) can be expressed by formula (6) as a matrix of N×2.

$$\begin{pmatrix} S_1 \\ S_2 \\ \vdots \\ S_N \end{pmatrix} = \frac{1}{a} \begin{pmatrix} C_{11} & C_{12} \\ C_{21} & C_{22} \\ \vdots & \vdots \\ C_{N1} & C_{N2} \end{pmatrix} \begin{pmatrix} P_1 \\ P_2 \end{pmatrix} \quad (6)$$

From formula (6), if sensitivity distribution $C_{ij}$ of receiving coil is found, a nucleate factor in measuring the object, e.g. proton density distribution $P_j$ can be calculated by calculating the inverse matrix.

Similarly, a general formula in performing imaging at M-fold speed using N coils is can be expressed by formula (7), where Y'=Y/M and $1 \leq y' \leq Y'$. Here, character b is a fixed number.

$$\begin{pmatrix} S_1 \\ S_2 \\ \vdots \\ S_N \end{pmatrix} = \frac{1}{b} \begin{pmatrix} C_{11} & C_{12} & \cdots & C_{1M} \\ C_{12} & C_{22} & \cdots & C_{2M} \\ \vdots & \vdots & \ddots & \vdots \\ C_{N1} & C_{N2} & \cdots & C_{NM} \end{pmatrix} \begin{pmatrix} P_1 \\ P_2 \\ \vdots \\ P_M \end{pmatrix} \quad (7)$$

In this manner, by performing the matrix calculation of formula (7) on measured data s'i(x, y') using sensitivity distribution $C_{ij}$ of receiving coil, density distribution $P_j$ of nuclear spin in the measuring portion is calculated as image data in which the aliasing is removed. Meanwhile, a relationship between the receiving coil number (N) and the acceleration factor (M) in the parallel imaging is mathematically $N \geq M$. Further, the sensitivity distribution also may be calculated by low-pass filtering the data in a low-frequency band of the k space.

In the parallel imaging method of MRI apparatus according to this embodiment, sensitivity distribution $C_{ij}$ of each of receiving coils 4051 and 4052 is calculated on the basis of sensitivity image data generated from the measured data obtained in advance of the low-frequency band in the phase encoding direction of the k space in the pre-measurement pulse sequence.

The sensitivity image data for calculating sensitivity distribution $C_{ij}$ of receiving coils 4051 and 4052 are acquired by executing the pre-measurement sequence. In the pre-measurement pulse sequence, the interval between the phase encoding steps are not thinned out but the same as in the usual imaging. However, by reducing the phase encoding step number to be one of several fractions of that in the usual imaging, the repetition number of pulse sequence is reduced. For example, when the phase encoding step number in the k space is 64, in the usual imaging all data of 1st to 64th phase encode steps are measured. Meanwhile, in the pre-measurement sequence of parallel imaging, the phase encoding step number is set to be the same as in the usual imaging, and the data on 16 steps including 25th to 40th phase encode steps are measured in one portion of the k space, e.g. in the central portion (low-frequency area) of the k space. In this case, since the phase encoding step number becomes one fourth of that in the usual imaging, the time for pre-measurement is shortened. Control unit 411 executes the pre-measurement pulse sequence to acquire the data to be measured of the central portion being about one fourth of the k space so as to acquire the sensitivity image data for n slices of body coil 404 and receiving coils 4051 and 4052. In this manner, the sensitivity image data for one slice are measured with the small phase encoding step number and the sensitivity image data are acquired with the smaller number of slice position than that in the examination image, whereby the total imaging time of parallel imaging is shortened.

Next, a procedure of signal processing performed in the signal processing unit of MRI apparatus according to this embodiment will be described.

Figure 1:
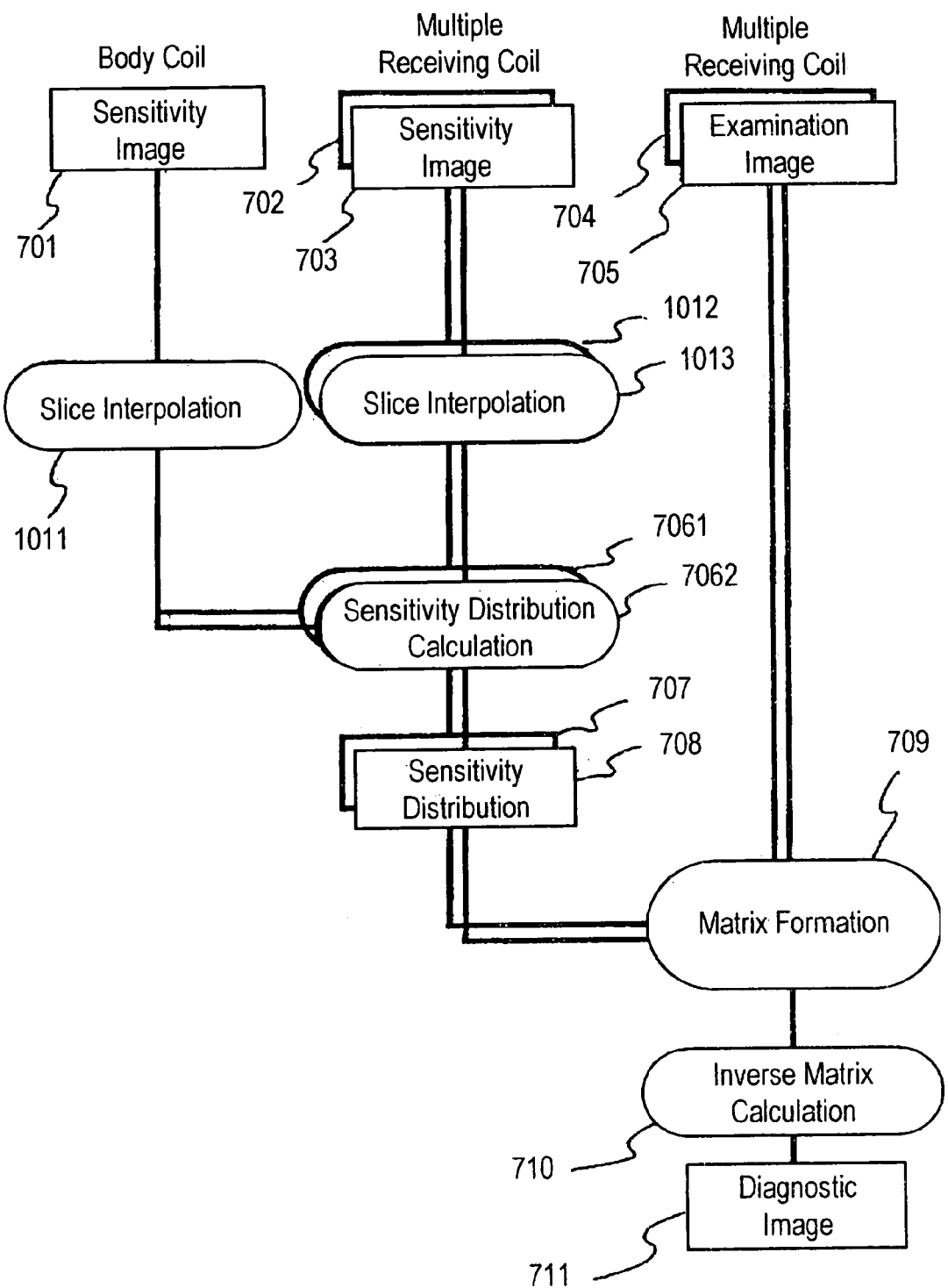
FIG. 1 is a diagram showing a procedure of signal processing of a signal processing unit in an MRI apparatus according to a first embodiment of the present invention.

As shown in FIG. 1, signal processing unit 407 according to this embodiment performs slice interpolation processings 1011, 1012, and 1013 on sensitivity image 701 of n in number of body coil 404 and on sensitivity images 702 and 703, each of n in number, respectively of receiving coils 4051 and 4052 of multiple receiving coils 301 obtained by executing the pre-measurement pulse sequence for sensitivity image data acquisition, and thus generates an interpolated sensitivity image so that all sensitivity images corresponding to the respective slice positions of examination image complete. Next, sensitivity distribution data 707 and 708 respectively of receiving coils 4051 and 4052 are calculated by sensitivity distribution calculation processings 7061 and 7062 using a whole sensitivity image including the sensitivity image generated by slice interpolation processing 1011 of body coil 404 and that including the sensitivity image generated by slice interpolation processings 1012 and 1013 of receiving coils 4051 and 4052 of multiple receiving coils 301. Calculated sensitivity distribution data 707 and 708 of receiving coils 4051 and 4052 are stored into a memory (not shown) mounted in control unit 411.

The above sensitivity distribution calculation processings 7061 and 7062 are the processing of dividing the sensitivity images of receiving coils 4051 and 4052 by the sensitivity image of body coil 404 while slice positions are matched.

After that, the real-measurement pulse sequence for the examination image data acquisition is executed, a determinant is formed by matrix forming processing 709 on the basis of obtained examination images 704 and 705, each for m slices, of receiving coils 4051 and 4052 of multiple receiving coils 301 and sensitivity distribution data 707 and 708, inverse matrix calculation processing 710 of the determinant is performed, and diagnostic image 711 without an aliasing is resultingly obtained.

Figure 7:
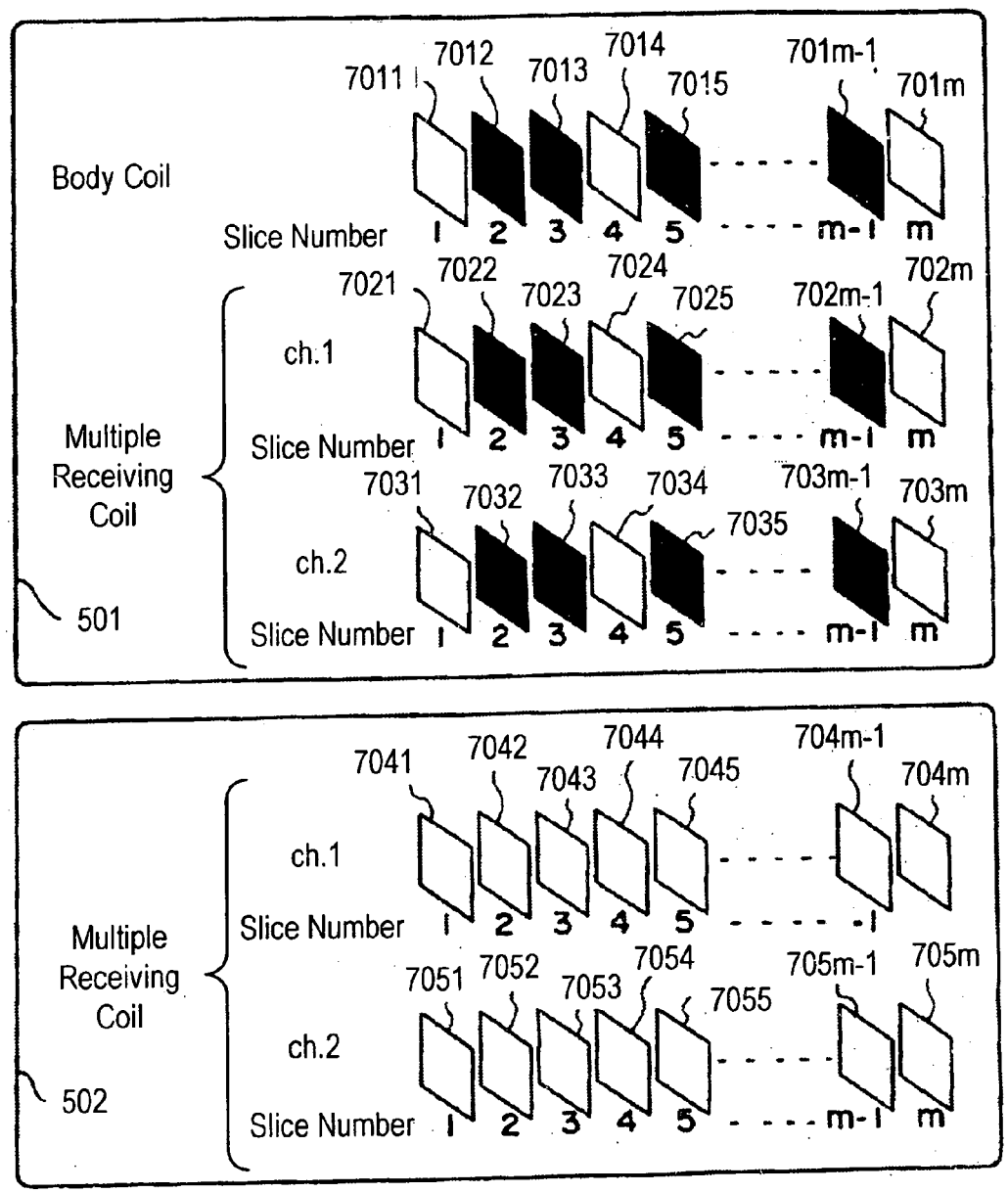
FIG. 7 is a diagram illustrating image data acquired in the pulse sequence and those generated by a slice interpolation processing in the MRI apparatus according to the first embodiment of the present invention.

By the way, sensitivity images 701, 702, and 703, each for n slices, obtained by executing the pre-measurement are sensitivity images 7011, 7014, . . . , and 701m of body coil 404, sensitivity images 7021, 7024, . . . , and 702m of receiving coil 4051 of multiple receiving coil 301, and sensitivity images 7031, 7034, . . . , 703m of receiving coil 4052 of multiple receiving coils 301, as shown in FIG. 7.

Meanwhile, examination images 704 and 705 including an aliasing artifact obtained by executing the real-measurement pulse sequence are examination images 7041 to 704m of receiving coil 4051 of multiple receiving coils 301 and examination images 7051 to 705m of receiving coil 4052 of multiple receiving coils 301. In FIG. 7, ch.1 corresponds to receiving coil 4051 of multiple receiving coils 301 and ch.2 corresponds to receiving coil 4052 of multiple receiving coils 301.

Each of those sensitivity images 701, 702, and 703 and examination images 704 and 705 is given a slice number corresponding to its slice position, and images having an identical slice number are those on an identical slice position. The slice number corresponds to the last one digit of image number. For example, sensitivity images 7011, 7014, . . . , and 701m of body coil 404 are respectively given the slice numbers 1, 4, . . . , and m. Further, slice intervals of the images obtained in the pre-measurement sequence and the real-measurement pulse sequence are evenly determined.

That is, in the pre-measurement pulse sequence, measurement is performed on every three slices as on slice numbers 1, 4, . . . , and m, and sensitivity image data 701 of body coil 404 and sensitivity image data 702 and 703 of receiving coils 4051 and 4052 are not acquired on slice numbers 2, 3, 5, . . . , and m-1. Accordingly, in examination images 7042, 7043, 7045, . . . , and 704m-1, and 7052, 7053, 7055, . . . , and 705m-1 of slice numbers 2, 3, 5, . . . , and m-1, the aliasing artifact cannot be removed without sensitivity distribution information on those slice positions.

Therefore, the signal processing unit according to this embodiment calculates sensitivity images 7012, 7013, 7015, . . . , and 701m−1 by performing slice interpolation processing 1011 from sensitivity images 7011, 7014, . . . , and 701m of body coil 404, similarly calculates sensitivity image 7022, 7023, 7025, . . . , and 702m−1 by performing slice interpolation processing 1012 from obtained sensitivity images 7021, 7024, . . . , and 702m of receiving coil 4051, and calculates sensitivity images 7032, 7033, 7035, . . . , and 703m−1 by performing slice interpolation processing 1013 from sensitivity images 7031, 7034, . . . , and 703m of receiving coil 4052. That is, reference number 501 in FIG. 7 represents a set of sensitivity image necessary for removing the aliasing artifact in the examination image including the sensitivity images acquired in the pre-measurement pulse sequence and the sensitivity image data acquired by slice interpolation processings 1011, 1012, and 1013, and reference number 502 represents a set of examination image including the aliasing artifact acquired by the real-measurement pulse sequence. Further, white sensitivity images in sensitivity image set 501 represent those actually acquired by in the pre-measurement pulse, sequence and black ones represent those generated by slice interpolation processing 101.

In sensitivity distribution calculation processing 706 performed in the MRI apparatus according to this embodiment, sensitivity distribution $c_i(x, y)$ is calculated from image data $s_i(x, y)$ of each receiving coil i on the basis of image data $sc(x, y)$ of the body coil, e.g. by relativising it using formula (8):

$$c_i(x,y) = s_i(x,y) \times sc(x,y) \quad (8)$$

Using thus calculated sensitivity distribution data 707 and 708 and acquired examination image data 7041 to 704m and 7051 to 705m respectively of receiving coils 4051 and 4052, a determinant of formula (7) is formed by matrix forming processing 709. After that, diagnostic image 711 in which an aliasing artifact is removed is obtained with reverse matrix calculation processing 710.

In a conventional MRI apparatus, although the phase encoding step number is set to be one of several fractions of that in the usual imaging in the pre-measurement pulse sequence, imaging for the sensitivity image data and that for the aliasing image data are performed for the same number of slices and on the same slice positions.

However, in the parallel imaging method, the time for executing the pre-measurement occupies a large proportion of the total imaging time. Especially, in the multi-slice and three-dimensional imaging, because the time of repetition (TR) and the repetition number of times of pulse sequence increase as the number of imaging slice is large, the execution time of the pre-measurement pulse sequence is a major matter in consideration of the efficiency of examination.

Meanwhile, in the MRI apparatus according to this embodiment, sensitivity image data 701, 702, and 703 are acquired for every several slices, e.g. for every three slices to reduce the slice number of the imaging sensitivity image data to be m being smaller than the slice number m of examination image. Accordingly, the repetition number of the pre-measurement pulse sequence is reduced, so that the imaging time can be shortened for thinned sensitivity image data 701, 702, and 703. Further, when this embodiment is applied to three-dimensional measurement, the slice encoding step number in the pulse sequence for sensitivity distribution acquisition can be reduced.

Further, in the pre-measurement pulse sequence according to this embodiment, since the sensitivity image data is acquired while the slice intervals are evenly thinned out, the sensitivity image data generated by slice interpolation processing 101 are accurately calculated with a simple calculation. In addition thereto, in the pre-measurement pulse sequence according to this embodiment, setting and control of pulse sequence in control unit 411 is simplified since the slice number is thinned out at even intervals to acquire the sensitivity image data.

Further, the sensitivity distributions of receiving coils 4051 and 4052 are stored in the memory of control unit 411. Accordingly, when it is necessary to image again 1st to mth slices while slightly shifting the slice positions thereof, it is possible to calculate the sensitivity distribution of each coil on the slice positions to be re-measured, by using the sensitivity distribution stored in the memory, without re-measuring them. Therefore, the time for re-measurement can be shortened.

Second Embodiment

Second embodiment of MRI apparatus according to the present invention will be described with reference to FIG. 8 and FIG. 9. Because the same functions as in the first embodiment are given the same reference marks, only the difference with the first embodiment will be hereinafter described.

Figure 8:
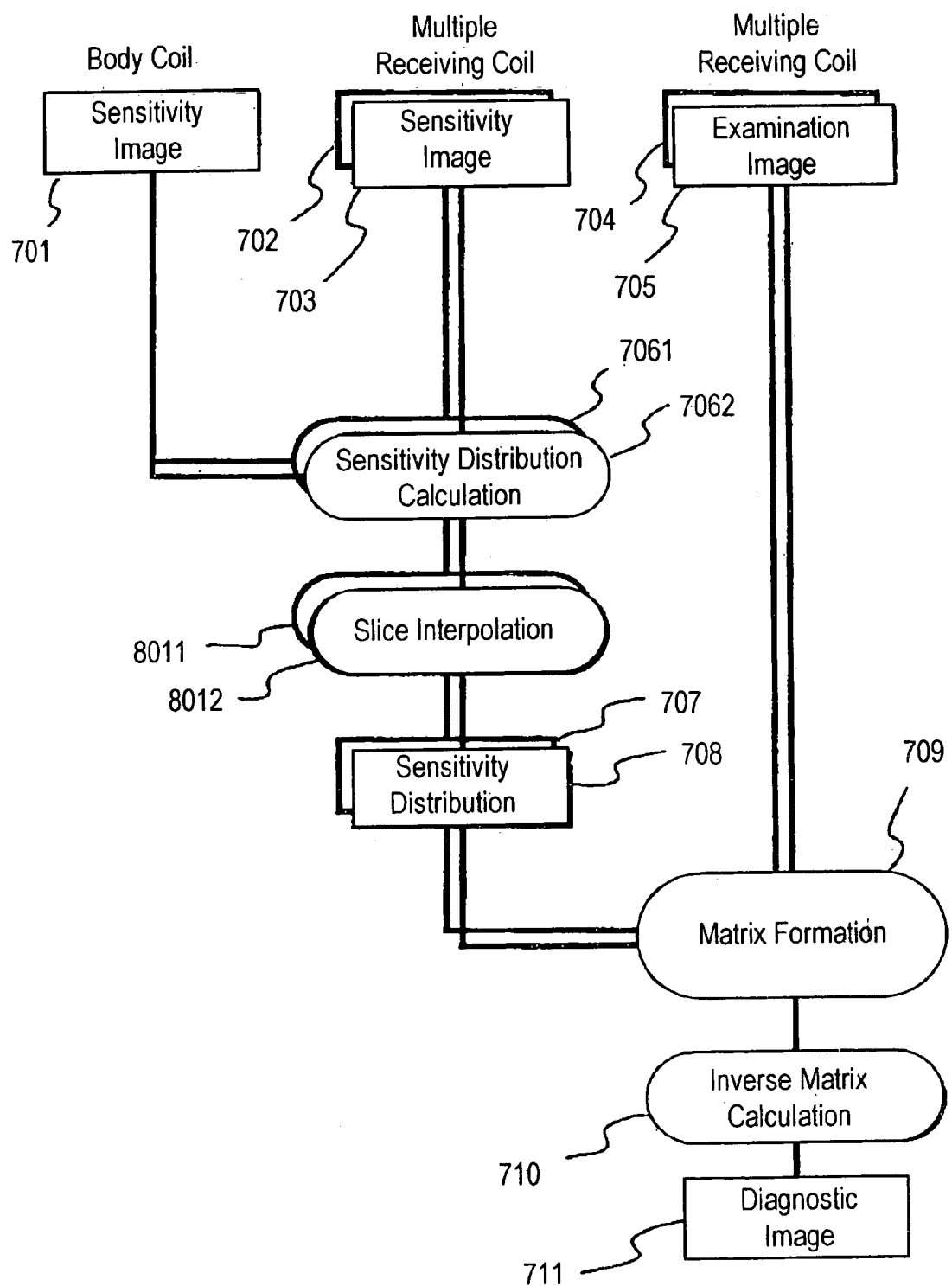
FIG. 8 is a diagram showing a procedure of signal processing in the signal processing unit in the MRI apparatus according to a second embodiment of the present invention.

The difference between this embodiment and the first embodiment is, as shown in FIG. 8, that slice interpolation processing 801 is performed after sensitivity distribution calculation processing 706 is performed using sensitivity image 701 of body coil 404 and sensitivity images 702 and 703 of receiving coils 7051 and 4052 of multiple receiving coils 301 acquired in the pre-measurement pulse sequence for the sensitivity image data acquisition. Therefore, in the signal processing unit according to this embodiment, sensitivity distribution data 7061 and 7062 of receiving coils 4051 and 4052 are calculated from sensitivity image 701 of body coil 404 and sensitivity images 702 and 703 of receiving coils 4051 and 4052, the slice interpolation processing 801 is performed next using those sensitivity distribution data 7061 and 7062 to acquire sensitivity distribution data 707 and 708 of receiving coils 4051 and 4052, matrix forming processing 709 is performed after that from those sensitivity distribution data 707 and 708 and examination images 704 and 705, and the aliasing artifact in examination images 704 and 705 are removed by performing inverse matrix calculation processing 710 on the formed matrix.

Here, sensitivity distribution data of receiving coils 4051 and 4052 calculated by sensitivity distribution calculation processing 706 and those generated by slice interpolation processing 801 will be described.

Figure 9:
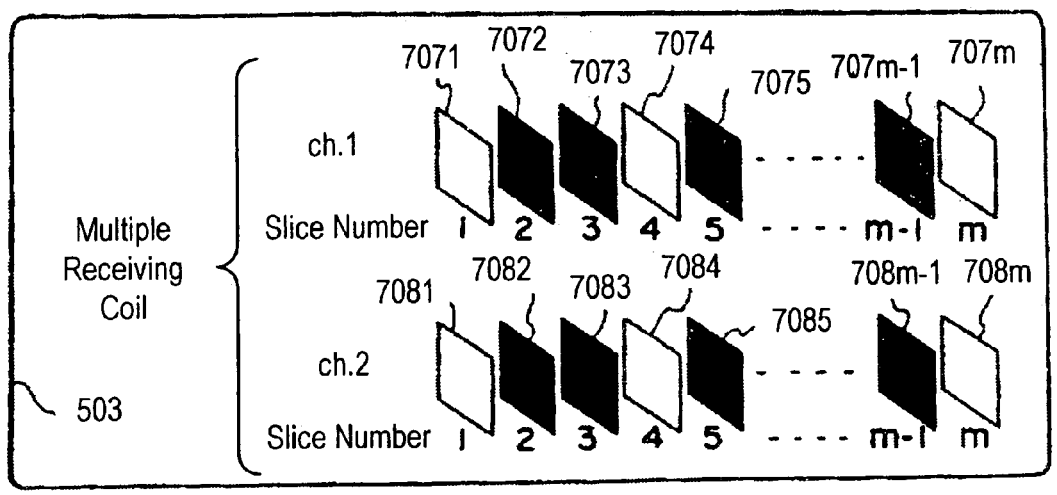
FIG. 9 is a diagram illustrating sensitivity distribution data generated by a sensitivity distribution calculation processing and a slice interpolation processing and image data acquired in the pulse sequence in the MRI apparatus according to the second embodiment of the present invention.
Figure 9:
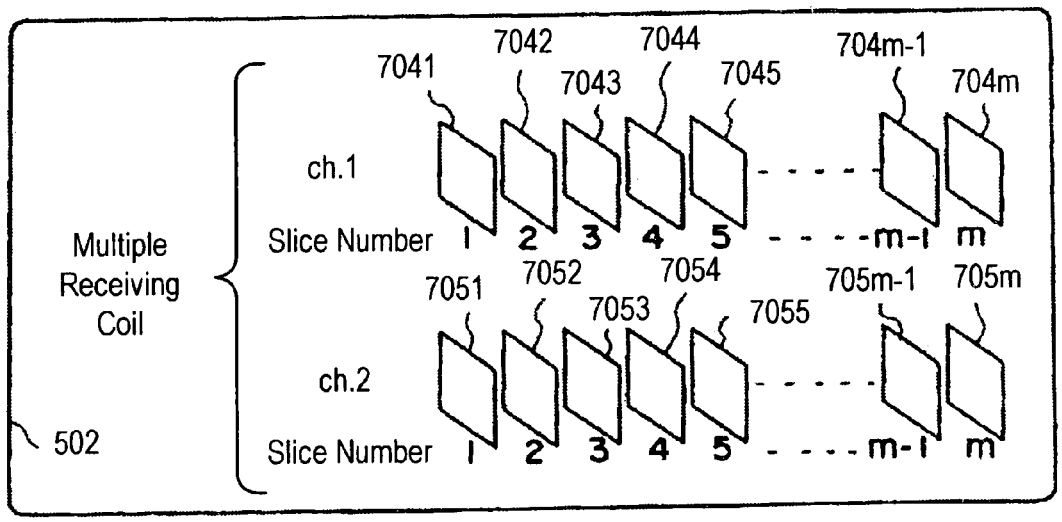

Sensitivity distribution data calculated by sensitivity distribution calculation processing 706 are, as shown in FIG. 9, sensitivity distribution data 7071, 7074, . . . , and 707m of receiving coil 4051 of multiple receiving coils 301 and sensitivity distribution data 7081, 7084, . . . , and 708m of receiving coil 4052.

In the pre-measurement pulse sequence according to this embodiment, the number of measured slices are reduced by setting measuring slice positions as every three slices as in the first embodiment. That is, the sensitivity image data of slice numbers 1, 4, . . . , and m are acquired and those of slice numbers 2, 3, 5, . . . , and m−1 are not acquired. The aliasing artifact appearing in examination images 7042, 7043, 7045, . . . , and 704m−1 and 7052, 7053, 7055, . . . , and 705m-1 cannot be removed without the sensitivity distribution data of slice numbers 2, 3, 5, . . . , and m-1.

Therefore, in the signal processing unit according to this embodiment, sensitivity distribution data 7072, 7073, 7075, . . . , and 707m-1 are calculated by performing slice interpolation processing 8011 on acquired sensitivity distribution data 7071, 7074, . . . , and 707m of receiving coil 4051, and sensitivity distribution data 7082, 7083, 7085, . . . , and 708m-1 are calculated by performing slice interpolation processing 8012 on sensitivity distribution data 7081, 7084, . . . , and 708m of receiving coil 4052.

In other words, reference number 503 in FIG. 9 represents a data set necessary for removing the aliasing artifact in the examination image, including sensitivity distribution data calculated by sensitivity distribution calculation processings 7061 and 7062 and those obtained by slice interpolation processings 8011 and 8012. The white sensitivity image in data set 503 represents the sensitivity distribution data calculated by sensitivity distribution calculation processings 7061 and 7062, and the black sensitivity distribution data represent sensitivity distribution data generated with by interpolation processing 801.

In this manner, signal processing unit 407 performs slice interpolation processings 8011 and 8012 after performing sensitivity distribution calculation processings 7061 and 7062 on the basis of sensitivity image data 701, 702, and 703 acquired in the pre-measurement pulse sequence, forms sensitivity distribution data 7071 to 707m and 7081 to 708m corresponding to each slice position of examination images 7041 to 704m and 7051 to 705m, and after that removes the aliasing artifact in the image by matrix forming processing 709 and inverse matrix calculation processing 710.

Thus, according to this embodiment, since slice interpolation processing 801 is performed after calculating sensitivity distributions of receiving coils 4051 and 4052 on the basis of sensitivity images 701, 702, and 703 acquired in the first pulse sequence, it is unnecessary to perform the slice interpolation processing on sensitivity image 701 of body coil 404. Therefore, in comparison with First embodiment where slice interpolation processing 1011 is performed on sensitivity image 701 of body coil 404, it is possible to simplify sensitivity distribution calculation processing 706 and shorten the time for image reconstruction.

Third Embodiment

Next, the third embodiment of MRI apparatus according to the present invention will be described with reference to FIG. 10 and FIG. 11. Meanwhile, in this embodiment, too, the same function as in First embodiment is given the same reference mark and the description thereof will be omitted. The structure different from First embodiment and the characteristic part will be described hereinafter.

The difference between this embodiment and First embodiment lies in that the multiple receiving coils include four receiving coils. That is, as shown in FIG. 10, multiple receiving coils 301A forming an RF probe in the MRI apparatus according to this embodiment include four figure-of-eight shaped receiving coils 4051 to 4054, which are arranged opposite on the X-Y plane and on the T-Z plane at a predetermined distance.

Figure 11:
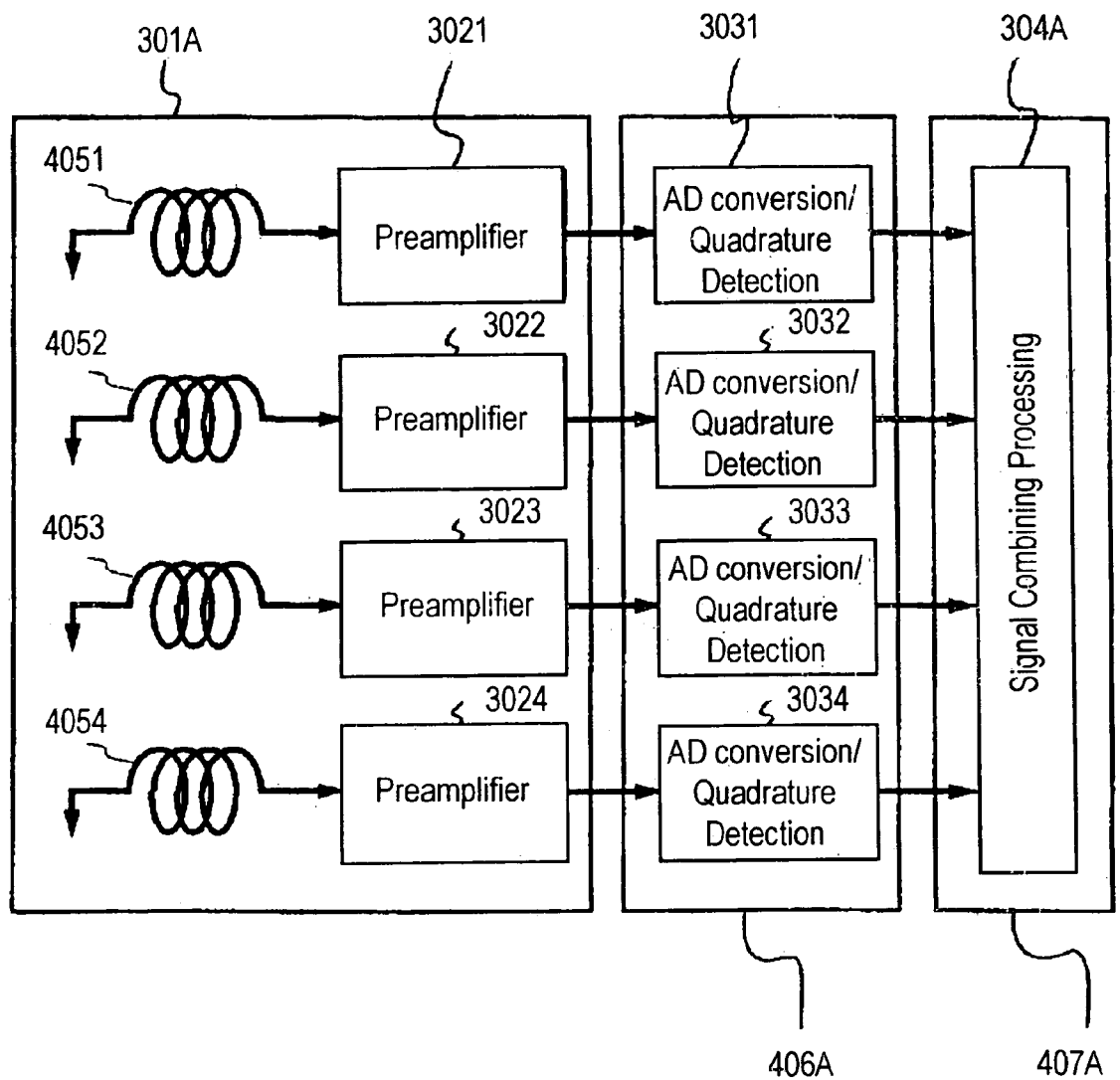
FIG. 11 is a diagram showing a schematic structure of multiple receiving coils and a reception unit in the MRI apparatus according to the third embodiment of the present invention.

Further, as shown in FIG. 11, four receiving coils 4051 to 4054 of multiple RF receiving coils 301A according to this embodiment are respectively connected to preamplifiers 3021 to 3024. In signal detecting unit 406A, four AD conversion/quadrature detection circuits 3031 to 3034 are arranged in parallel, which are respectively connected to outputs of preamplifiers 3021 to 3024.

By the way, when the parallel imaging is executed, a portion of low sensitivity is generated in some cases depending on the arranging relationship and the sensitivity distribution of the plural receiving coils. In this case, the matrix calculation of formula (7) may diverge to generate an artifact or deteriorate image quality.

In the MRI apparatus according to this embodiment, among four receiving coils two optimum combinations of receiving coils is formed on the basis of an imaging cross section and the phase encoding direction. Here, "optimum combination of receiving coil" is a combination with which the matrix calculation does not diverge. For example, there may be such conditions that there is not a portion of low sensitivity distribution in the phase encoding direction, that sensitivity distributions of receiving coil groups are not identical, and the like.

Figure 10:
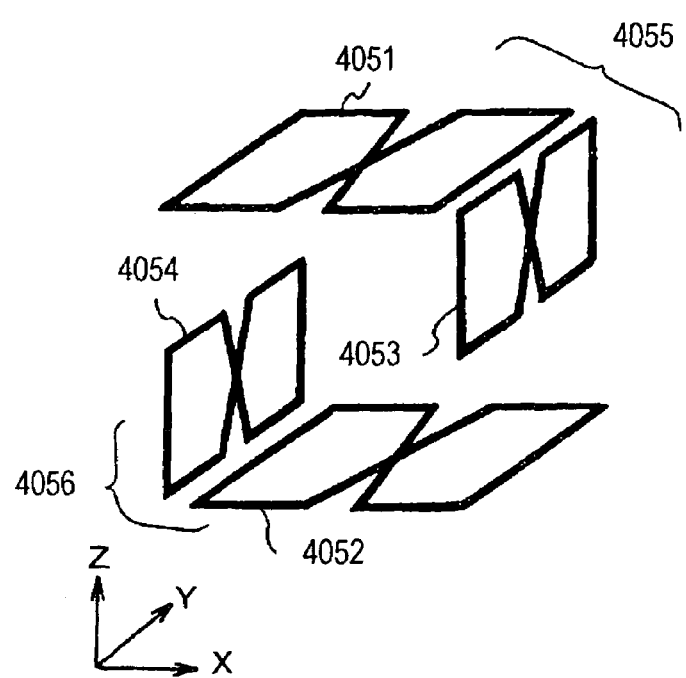
FIG. 10 is a diagram illustrating a receiving coil in the MRI apparatus according to a third embodiment of the present invention.
Figure 5:
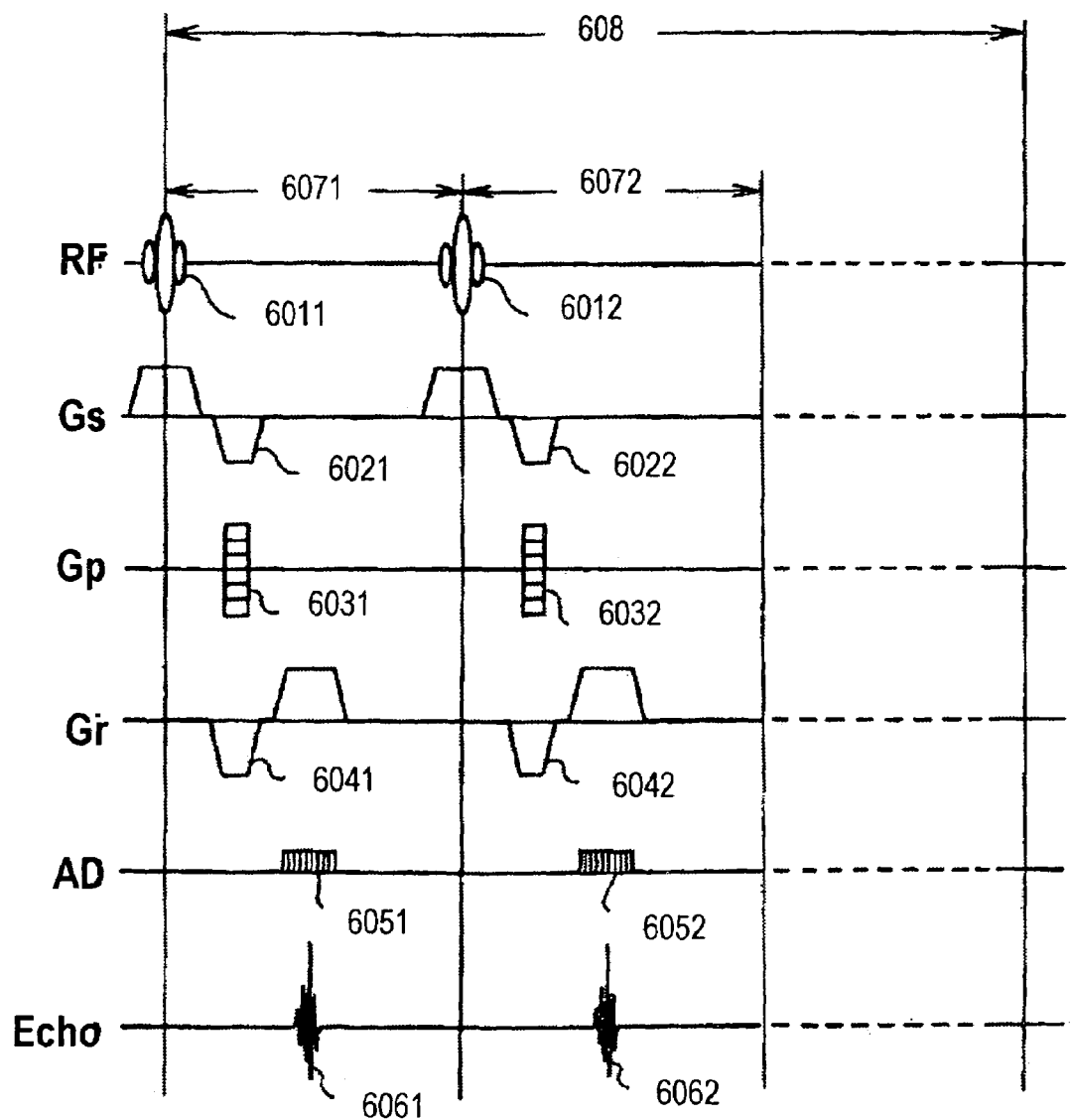
FIG. 5 is a chart illustrating a pulse sequence used in the MRI apparatus according to the present invention.

As shown in FIG. 10, two receiving coils 4051 and 4052 according to this embodiment are arranged opposite in the Z direction on the X-Y plane at a predetermined distance. Further, two receiving coils 4053 and 4054 are oppositely arranged in the X direction on a plane parallel to the Z-Y plane at a predetermined distance. Among those four receiving coils, receiving coils 4051 and 4053 are combined to form receiving coil group 4055, and receiving coils 4052 and 4054 are combined to form receiving coil group 4056. When the receiving coils are thus arranged and combined, the combined sensitivity distribution data of receiving coils 4051 and 4053 and that of receiving coils 4052 and 4054 become different from each other and the number of low sensitivity portions decreases, whereby the matrix calculation does not easily diverge.

Because this optimum coil combination is determined depending on the imaging cross section and the phase encoding direction if the coil arrangement is fixed, the apparatus is desirably constructed so that the optimum combination is automatically selected when those imaging conditions are determined.

In signal processing unit 407A, two sets of sensitivity image data measured by the two selected combinations of receiving coils are picked up, and those sensitivity image data of each set are combined. Similarly, two sets of examination image data measured by the two selected combinations of receiving coils are picked up and those examination image data of each set are combined. The sensitivity, image data of receiving coil group 4055 generated by thus combining those data correspond to sensitivity image data 7021, 7024, . . . , and 702m in ch.1 of FIG. 7, and those of receiving coil group 4056 correspond to sensitivity image data 7031, 7034, . . . , and 703m in ch.2.

Similarly, the combined examination image data of receiving coil group 4055 correspond to examination image data 7041 to 704m in ch.1 of FIG. 7 and those of receiving coil group 4056 correspond to examination image data 7051 to 705m in ch.2.

That is, the sensitivity image data acquired by receiving coils 4051 to 4054 are combined in signal combination processing unit 304A into sensitivity image data 702 and 703 in ch.1 and ch.2 corresponding to the sensitivity distribution of each predetermined receiving coil group, and also made into reference data of the matrix calculation for removing the aliasing artifact in examination image data 704 and 705 of ch.1 and ch.2 combined in each receiving coil group.

Here, because the sensitivity image data and examination image data acquired by receiving coils 4051 to 4054 are complex numbers, the combination processing based on, e.g. complex addition is done in signal combination processing unit 304A. Alternatively, however, the combination processing may be done by calculating a root sum square of two sets of sensitivity image data and that of two sets of examination image data. The latter case brings an advantage of higher SN ratio in comparison with the complex addition. Meanwhile, in the procedure of signal processing shown in FIG. 11, the signals are combined after the AD conversion. However, combining processing may be done on analog signals before being subjected to the AD conversion, and the AD conversion is performed afterward on them.

In this manner, in the rapid parallel imaging using the multiple receiving coils in the MRI apparatus according to this embodiment, an optimum combination of receiving coils is selected considering the imaging cross section and the encoding axis, and the matrix calculation is performed on the combined measured data of the receiving coil combination, whereby image deterioration caused by the matrix calculation is avoided and a good image is obtainable. Matrix [G×M] is calculated in this matrix calculation, where the thinning out ratio of signal is 1/M and the combination number of receiving coils is G (here, G=2, . . . , N, which corresponds to N in formula (7)). According to Third embodiment, since four receiving coils 4051 to 4054 are combined into two receiving coil groups (G=2) and the matrix calculation is done on the combined measured data of each of two receiving coil groups, the matrix is [2×2], and thus the calculation can be simplified.

Further, even when the imaging cross section and the encoding axis are changed, a stable image without an artifact and deterioration is obtainable. Moreover, it is possible to reduce a burden of the matrix calculation and rapidly reconstruct an image.

In this embodiment, when the first combination and the second combination of receiving coils are selected, one receiving coil may be overlapped in both the first and the second combinations. That is, the plural combinations of receiving coils may include a common receiving coil. Since the plural combinations of receiving coils may thus share a part of receiving coils, the coil combinations with which an optimum sensitivity distribution is obtainable can be more flexibly selected and a better quality image is obtainable.

The present invention is not limited to the above disclosed embodiments and may employ various embodiments in consideration of the gist of the invention. For example, although First to Third embodiments are described with regard to the case where the pre-measurement pulse sequence for the sensitivity distribution acquisition is performed on every three slices, it may be done on every arbitrary number of slices.

Further, although First to Third embodiments are described with regard to the case where the slice intervals in acquiring the image data are equivalent, they may be changed to acquire the image data in the MRI apparatus according to the present invention.

Further, although two receiving coils are used according to First and Second embodiments and four receiving coils are used according to Third embodiment, the number of receiving coils is not limited to two and four. That is, it may be eight or other number. However, to simplify the circuitry of the apparatus and to reduce the object's uncomfortable feeling, it is considered that the number of receiving coils is desirably smaller.

Further, although First to Third embodiments are described with regard to the case where the interval between the phase encoding steps in the pulse sequence for calculating the sensitivity of receiving coil is twice as in the usual imaging, or the thinning ratio is 1/2, the step interval may be set as three times, four times, or more. In this case, it is necessary to set number G of selected combination of receiving coils to be the same number as interval M of the phase encoding steps or more. However, G=M is preferable for simplifying the matrix calculation.

Further, although First to Third embodiments are described with regard to the case of employing the gradient echo sequence, the type of the parallel imaging and the measurement method are not limited. For example, it is possible to employ the SE pulse sequence, the FSE pulse sequence, the EPI pulse sequence, the SSFP method, and the spiral measurement method.

Further, the MRI apparatus according to the present invention is applicable not only to the multi-slice measurement method of these embodiments but also to the three-dimensional measurement method. In this case, the data may be thinned out not in the phase encoding direction but in the slice encoding direction, or in both the phase encoding direction and the slice encoding direction in combination. Alternatively, the combination of receiving coil may be selected so that the combination of sensitivity distributions is optimum in the axis direction in which the encoding steps are thinned out.

Further, in the signal processing done in the signal processing unit according to the present invention, slice interpolation processings 101 and 801 may be, e.g. a spline interpolation processing, an interpolation processing based on a Sinc function, a function-based fitting processing, and the like.

Further, in the MRI apparatus according to the present invention, an approximate sensitivity distribution of receiving coil can be calculated by generating a sensitivity image data having a uniform sensitivity distribution by combining sensitivity image data acquired by plural receiving coils instead of the body coil according to those embodiment, and dividing the image data acquired by each receiving coil by thus combined sensitivity image data. However, the sensitivity distribution of receiving coil can be accurately calculated by dividing the image data acquired by each receiving coil by the image data of body coil having a relatively uniform sensitivity distribution described in the above embodiments and calculating the approximate sensitivity distribution of receiving coil. Therefore, the latter is preferable.

Further, the multiple receiving coils of the MRI apparatus according to the present invention are not limited to those according to First to Third embodiments, and various multiple receiving coils may be utilized, such as ones mentioned in "Array Head Coil for Improved Functional MRI" (Christoph Leussler), 1996 ISMRM abstract p. 249, ones mentioned in "Helmet and Cylindrical Shaped CP Array Coils for Brain Imaging: A Comparison of Signal-to-Noise Characteristics" (H. A. Stark, E. M. Haacke), 1996 ISMRM abstract P. 1412 as a head QD multiple RF coils for horizontal magnetic field, and ones mentioned in "Four Channel Wrap-Around Coil with Inductive Decoupler for 1.5T Body Imaging" (T. Takahashi et. al), 1995 ISMRM abstract P. 1418 as an abdominal QD multiple RF coils for horizontal magnetic field. The multiple receiving coils are designed to enlarge an FOV while maintaining high sensitivity of receiving coil to improve the whole sensitivity by combining signals acquired by each of arranged small-sized receiving coils having a relatively high sensitivity. Accordingly, it is possible to enlarge the FOV and improve the whole sensitivity by combining the reconstructed images of each of those receiving coils into one image.

Further, although First to Third embodiments are described for the case of utilizing a horizontal magnetic field type MRI apparatus in which the static magnetic field direction (Z direction) is horizontal, the present invention is not limited thereto and also applicable to an MRI apparatus in which the static magnetic field direction is vertical.

As described above, according to the present invention, because the sensitivity distribution of receiving coil for removing an aliasing artifact generated in an examination image obtained in the parallel imaging can be acquired by measuring data on fewer slices than imaging slices, it can be acquired within a short time. Therefore, the total imaging time in the parallel imaging can be shortened. Further, since an unacquired sensitivity distribution of the receiving coil on imaging slices is calculated with the interpolation calculation, the calculation can be easily performed.

The invention claimed is:

1. A magnetic resonance imaging apparatus comprising:
a plurality of receiving coils for receiving a magnetic resonance signal generated from an object to be examined;
means for acquiring examination image data of each of the plural receiving coils from a plurality of slice positions on the object by executing a first pulse sequence using the plural receiving coils while a phase encoding matrix in a k space is thinned out;
artifact removing means for removing an aliasing artifact in the examination image using sensitivity distribution data of the receiving coils; and
sensitivity image data acquiring means which acquires sensitivity image data by executing a second pulse sequence using the plural receiving coils from first and second slice positions, which have at least one unacquired slice position therebetween, of the plural slice positions on the object,
wherein the artifact removing means calculates the sensitivity image data of the receiving coils of the at least one unacquired slice position with a slice interpolation using the sensitivity image data of the first and the second slice positions, and generates the sensitivity distribution data of the plural receiving coils on the slice positions of the examination image data on the basis of the plural sensitivity image data.

2. A magnetic resonance imaging apparatus according to claim 1, wherein the plural receiving coils include a receiving coil having a substantially uniform sensitivity distribution and a multiple receiving coil having a plurality of receiving coils.

3. A magnetic resonance imaging apparatus according to claim 2, wherein the receiving coil having a substantially uniform sensitivity distribution is a coil which is also used for transmitting an RF pulse.

4. A magnetic resonance imaging apparatus according to claim 2, wherein the examination image data acquiring means measures the NMR signal while thinning out every N steps in the phase encoding matrix of the k space of each receiving coil, where the number of receiving coils forming the multiple receiving coils is N.

5. A magnetic resonance imaging apparatus according to claim 2, wherein the sensitivity distribution of each receiving coil of the multiple receiving coils is calculated by dividing the sensitivity image of each receiving coil by the sensitivity image obtained by the receiving coil having a substantially uniform sensitivity distribution.

6. A magnetic resonance imaging apparatus according to claim 1, wherein n<m where the number of slices of sensitivity image data of the plural receiving coils is n and the number of slices of the examination image data is m.

7. A magnetic resonance imaging apparatus according to claim 1, wherein the plural sensitivity image data are acquired with a multi-slice pulse sequence.

8. A magnetic resonance imaging apparatus according to claim 1, wherein the sensitivity image data acquiring means measures an NMR signal of each of the plural receiving coils only in a low-frequency region of the k space having a predetermined phase encoding matrix.

9. A magnetic resonance imaging apparatus according to claim 8, wherein the low-frequency region of the k space measured by the sensitivity image data acquiring means is the central portion in phase encoding direction of the k space and about one-fourth size of the whole phase encode matrix.

10. A magnetic resonance imaging apparatus according to claim 1, wherein one or more sensitivity images of the multiple receiving coils corresponding to the slice positions of the examination image which is not yet measured are calculated with an interpolation calculation using the measured sensitivity distribution data.

11. A magnetic resonance imaging apparatus according to claim 1, wherein the number of the plural receiving coils is two.

12. A magnetic resonance imaging apparatus according to claim 1, wherein the number of the plural receiving coil is three or more, those receiving coils are combined into a plurality of receiving coil group, and sensitivity distribution data are combined at each receiving coil group.

13. A magnetic resonance imaging apparatus comprising:
a plurality of receiving coils for receiving an NMR signal generated from an object to be examined;
means for acquiring an examination image data with each of the plural receiving coils from a plurality of slice positions on the object by executing a first pulse sequence using the plural receiving coils where a phase encoding matrix of the k space is thinned out;
means for forming a determinant from sensitivity distribution of the plural receiving coils and the examination image data of each of the receiving coils; and
artifact removing means for removing an aliasing artifact in the examination image by performing an inverse matrix calculation of the determinant; and
sensitivity image data acquiring means which acquires sensitivity image data by executing a second pulse sequence using the plural receiving coils from first and second slice positions, which have at least one unacquired slice position therebetween, of the plural slice positions on the object,
wherein the sensitivity image data of the receiving coils of the at least one unacquired slice position is calculated with a slice interpolation using the sensitivity image data of the first and the second slice positions, and the sensitivity distribution of the plural receiving coils on the slice positions of the examination image data is determined on the basis of the plural sensitivity image data.

14. A magnetic resonance imaging apparatus comprising:
a plurality of receiving coils for receiving a nuclear magnetic resonance signal generated from an object to be examined;
means for acquiring examination image data from a plurality of slice positions on the object by executing a first pulse sequence using the receiving coils while a phase encoding matrix of the k space is thinned out;

sensitivity image data acquiring means which acquires sensitivity image data by executing a second pulse sequence using the plural receiving coils from first and second slice positions, which have at least one unacquired slice position therebetween, of the plural slice positions on the object; and artifact removing means for removing an aliasing artifact in the examination image using sensitivity distribution data of each receiving coil, wherein the sensitivity image data of the receiving coils of the at least one unacquired slice position is calculated with a slice interpolation using the sensitivity image data of the first and the second slice positions, and the sensitivity distribution data of the plural receiving coils on the slice positions of the examination image data is generated on the basis of the plural sensitivity image data.

15. A magnetic resonance imaging method comprising:

receiving a magnetic resonance signal generated from an object to be examined;

acquiring examination image data of each of the plural receiving coils from a plurality of slice positions sequentially adjoining on the object by executing a first pulse sequence using the plural receiving coils while a phase encoding matrix in a k space is thinned out;

acquiring sensitivity image data by executing a second pulse sequence using the plural receiving coils from first and second slice positions, which have at least one unacquired slice position therebetween, of the plural slice positions on the object, the sensitivity image data of the receiving coils of the at least one unacquired slice position being calculated with a slice interpolation using the sensitivity image data of the first and the second slice positions;

generating sensitivity distribution data of the plural receiving coils on the slice positions of the examination image data on the basis of the plural sensitivity image data; and removing an aliasing artifact in the examination image using the sensitivity distribution data of the receiving coils.

16. The method of claim 15, wherein n<m where the number of sensitivity image data of the plural receiving coils is n and the number of the examination image data is m.

17. The method of claim 15, further comprising calculating one or more sensitivity images of the multiple receiving coils corresponding to the slice positions of the examination image which is not yet measured with an interpolation calculation using the measured sensitivity distribution data.

* * * * *